United States Patent [19]

Mauerhofer

[11] Patent Number: 5,655,749
[45] Date of Patent: Aug. 12, 1997

[54] PROCESS AND DEVICE FOR THE CONTACTLESS ELECTRONIC CONTROL OF THE FLOW OF WATER IN A PLUMBING UNIT

[75] Inventor: Alex Mauerhofer, Vilters, Switzerland

[73] Assignee: Geberit Technik AG, Jona, Switzerland

[21] Appl. No.: 474,679

[22] Filed: Jun. 7, 1995

[30] Foreign Application Priority Data

Jun. 13, 1994 [CH] Switzerland .................. 01 859/94

[51] Int. Cl.$^6$ ........................................ F16K 31/02
[52] U.S. Cl. ............................ 251/129.04; 324/435
[58] Field of Search ............... 251/129.04; 324/435; 340/636

[56] References Cited

U.S. PATENT DOCUMENTS

| | | | |
|---|---|---|---|
| 4,413,234 | 11/1983 | Lupoli | ........................ 324/435 |
| 4,521,735 | 6/1985 | Kageyama et al. . | |
| 5,217,035 | 6/1993 | Van Marcke . | |
| 5,406,266 | 4/1995 | Mino et al. | ........................ 324/435 |
| 5,458,147 | 10/1995 | Mauerhofer | ........................ 251/129.04 |
| 5,519,383 | 5/1996 | DeLa Risa | ........................ 324/435 |

FOREIGN PATENT DOCUMENTS

| | | |
|---|---|---|
| 0313162A2 | 4/1989 | European Pat. Off. . |
| 0423102A1 | 4/1991 | European Pat. Off. . |
| 0433631A1 | 6/1991 | European Pat. Off. . |
| 0600234A2 | 6/1994 | European Pat. Off. . |
| 3920581A1 | 1/1991 | Germany . |
| 646766A5 | 12/1984 | Switzerland . |
| 651143A5 | 8/1985 | Switzerland . |

*Primary Examiner*—John T. Kwon
*Attorney, Agent, or Firm*—McGlew and Tuttle

[57] ABSTRACT

To guarantee a higher reliability of operation, the capacity of a battery to reliably open and close a water valve and to operate a microprocessor is continuously checked. To do so, a plurality of reference voltages are formed. The current voltage of the battery is compared with these reference voltages, and the state of the battery is indicated on the basis of this comparison with, e.g., an LED.

20 Claims, 1 Drawing Sheet

PROCESS AND DEVICE FOR THE CONTACTLESS ELECTRONIC CONTROL OF THE FLOW OF WATER IN A PLUMBING UNIT

FIELD OF THE INVENTION

The present invention pertains to a process and device for monitoring the power available to a valve in a plumbing unit, and in particular the present invention relates to a process and device where operation of a plumbing unit is adapted to the available power.

BACKGROUND OF THE INVENTION

Processes and devices for the contactess electronic control of the flow of water in washing units have been known from, e.g., CH-A-651 143, CH-A-646 766 and DE-A 39 20 581. If these devices are operated from a battery, the battery in time must be replaced upon reaching a certain residual capacity. To indicate that a battery change is due, it was previously determined whether the battery voltage exceeded a predetermined voltage value. An insufficient voltage was indicated by means of an LED.

SUMMARY AND OBJECTS OF THE INVENTION

The object of the present invention is to provide a process and a device of the class described, which guarantee a higher reliability of operation and more efficient operation.

The present invention has an electrically operated valve and a control circuit means for opening and closing the valve in response to sensory inputs. A power supply, usually a battery, is used to energize the control circuit and the valve. The minimum power required to open and close the valve, as well as the minimum power needed to operate the control circuit means is determined. Since the power supply is usually a battery, the power reserve of the battery can be determined by the voltage of the battery. The power requirements of the valve and control circuit can also be equated with a voltage level of the battery.

When the voltage level of the battery is below the minimum voltage required to open the valve plus a safety factor of usually 10%, with respect to the minimum opening voltage, the present invention indicates a low battery state. The voltage of the battery is checked at substantially regular intervals, and also when the control means is opening or closing the valve. The voltage when the valve is opening and closing, is known as the loaded voltage, and the battery voltage measured otherwise is known as the unloaded voltage.

In particular, the present invention prevents the water valve from being able to be actuated and opened without being able to be closed any more at an insufficient battery or power supply voltage. The microprocessor or control means can also be prevented from assuming an uncontrolled state.

Another advantage is considered to be the fact that the battery capacity can be used up to a guaranteed minimum valve-closing voltage. The useful life of a battery is thus extended, without the risk of an increased number of malfunctions.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DETAILED DESCRIPTION OF THE PREFERRED EMBODIMENT

Figure 1:
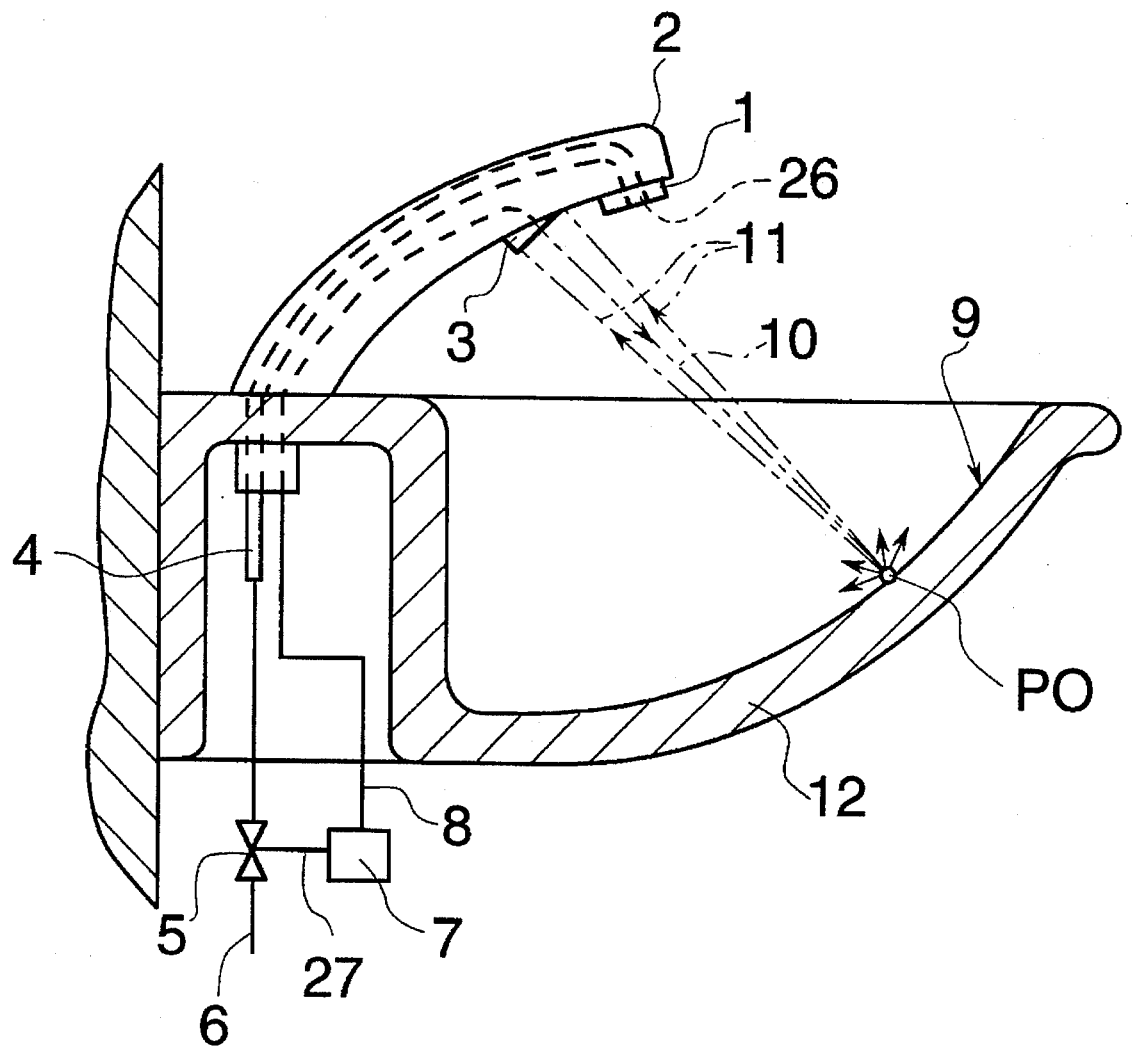
FIG. 1 is a cross-sectional view of a water flow device with contactless electronic control.

The contactless electronic control is arranged, e.g., on a water outlet of a wash basin 12. For example, an infrared light scanner and receiver 3 is used to control the water valve 5. When, e.g., a hand is introduced into the area scanned by the infrared light scanner, the latter responds and sends a signal, which is amplified and causes the water valve to open or close. A microprocessor 7 is provided for the control, and a battery 6 is provided for power supply. An indicator 27 visible from the outside, e.g., an LED, which indicates the state of the battery 6, is provided as well.

The water valve 5 used is preferably a pulse servo valve, in which certain minimum limit values of the battery or power supply voltage can be set for reliable opening and closing. It should be borne in mind that, as a consequence of the unavoidable internal resistance of the battery, these limit values must be present and measured in the loaded state of the battery, i.e., at the end of the control pulse. The minimum closing voltage should be lower than the minimum opening voltage, so that it will always be possible after opening the valve to close the valve again with the same battery voltage.

To evaluate the state of the battery 6 or its ability to reliably open and close the valve and to reliably operate the microprocessor, three reference voltages are formed in the microprocessor.

The first reference voltage $V(1)$ corresponds to a battery voltage which corresponds to a capacity reserve or safety factor of still approx. 10% relative to the guaranteed minimum valve-opening voltage. The second reference voltage $V(0)$ corresponds to the guaranteed minimum valve-closing voltage. The third reference voltage $V(P)$ corresponds to the minimum battery voltage at which the microprocessor is still able to operate. $V(P)$ is lower than $V(0)$, and $V(0)$ is, in turn, lower than $V(1)$.

The residual capacity of a lithium battery 2CR5 can be approximately determined from its discharge curve, namely, the declining curve describing the battery voltage over the discharge time. This means that, e.g., a certain residual battery capacity can be associated with a residual capacity of 10% or complete discharge.

By comparing the current battery voltage in the loaded state or in the valve-loaded state with the above-mentioned reference voltages, the electronic unit assigns the current state of the battery to one of the following states:

| | |
|---|---|
| Test new battery | Initialization |
| Battery O.K. | State B0 |
| Battery reserve 10%, under load | State B1 |
| Battery reserve 10%, not loaded | State B2 |
| Battery reserve 0%, under load | State B3 |
| Minimal voltage for microprocessor | Shut-off of system B4 |

The different states are displayed by the indicator, e.g., as follows:

| | |
|---|---|
| Initialization | LED flashing |
| Battery state 0 | LED off |
| Battery state 1 | LED flashing |
| Battery state 2 | LED flashing |
| Battery state 3 | LED on continuously |
| System shut off | LED on continuously. |

The circumstances under which the different states can be entered and left are described in the following description of the function.

After inserting fie battery, the battery is tested to determined whether the no-load battery voltage is higher or lower than V(1).

If it is higher, initialization is started. The LED indicator flashes during the initialization.

If the no-load battery voltage is lower than V(1), an attempt was made to insert an already used battery. Starting the initialization is refused in this case, i.e., the LED indicator shows continuous light (if the battery is still able to energize the LED indicator).

State B0

This state means that the battery is OK. The LED indicator remains off.

The no-load battery voltage is measured at short time intervals, i.e., every second If it is determined that the battery voltage is higher than V(1), state B0 is set; otherwise, B2 (no load) is set.

The battery voltage under load is measured each time the valve is opened (measurement of the battery voltage at the end of the switch-on pulse!). If it is determined that the battery voltage is higher than V(1), state B0 is set; otherwise, B1 (load) is set.

State B1

This state means that the battery voltage under load corresponds to a battery reserve of less than 10% with respect to the minimum voltage necessary to switch on the valve. The battery should be replaced within the next 2 to 3 weeks.

This battery change, which has become necessary, is continuously indicated by an LED indicator flashing at a frequency of, e.g., 1 Hz.

The battery voltage under load is measured each time the valve is switched on, and it is compared with V(0). If this comparison shows a value lower than V(0), a switchover to stage B3 is performed.

If the battery is not replaced within the 2 to 3 weeks mentioned, it may happen that the system remains in state B1 even longer and continues to function. However, the valve must be expected to cease opening beginning from a certain point in time, even though the electronic unit is still energized!

Reason: The voltage may drop below the minimum switch-on voltage applicable to the valve in question before the minimum closing voltage V(0) guaranteed for all valves is reached.

The advantage of this method is that the battery capacity can be utilized up to the guaranteed minimum valve-closing voltage.

State B2

In an electronic wash basin not used for a relatively long lime, the battery might be discharged to the extent that valve actuation is no longer ensured. To cover this case, the no-load battery voltage is also measured at least once per second. If a value lower than V(1) is determined, a switchover to this state B2 is performed.

State B2 differs from state B1 only in that a closing pulse is sent to the valve before the valve is switched on next. The battery voltage under load, which is determined during the closing pulse and compared with V(1) and V(0), determines whether the valve may be switched on and changed over into the state B0 or B1, or whether a changeover directly into state B3 must be performed.

State B3

This state means that the battery voltage under load is no longer sufficient with certainty for closing the valve. The system therefore refuses to switch on the valve in this state, and this refusal is made visible to the user with continuous lighting of the LED indicator.

Yet, each time the wash basin is "used," a check is performed with a closing pulse on the valve to determine whether the available battery voltage under load might still be sufficient for switching the valve off. Blocking of the system, which might otherwise be brought about by an incorrect measurement, is thus reliably avoided.

State B4

The correct function of the microprocessor is guaranteed by the manufacturer only above a minimum operating voltage. If this instruction is ignored, the microprocessor may send any erratic output signal (e.g., a command to switch on the valve!). To avoid this, the microprocessor is switched off under this operating voltage limit value V(P).

The LED indicator is then further maintained in the state of continuous light by the hardware of the electronic module until the battery is exhausted.

While specific embodiments of the invention have been shown and described in detail to illustrate the application of the principles of the invention, it will be understood that the invention may be embodied otherwise without departing from such principles.

What is claimed is:

1. A process for electronic control of fluid flow, the process comprising the steps of:

providing an electrically operated valve;

determining energy requirements needed to open and close said valve;

providing a control circuit means for opening and closing said valve in response to sensory input;

determining energy requirements needed to properly operate said control circuit means;

substantially continuously measuring power deliverable by a power supply to energize said valve and said control circuit means.

2. A process in accordance with claim 1, wherein said energy requirements are in a form of reference voltages;

said measuring of said power of said power supply measures a loaded and unloaded power supply voltage of said power supply in a loaded and unloaded state respectively;

said loaded and unloaded voltages of said power supply are compared to said reference voltages to determine a power capacity of said power supply.

3. A process in accordance with claim 2, wherein said energy requirements to open said valve are in a form of a reference voltage V(1) substantially equal to a minimum voltage required to open said valve plus a safety factor;

said energy requirements to close said valve are in a form of reference voltage V(0) substantially equal to a minimum voltage required to close said valve;

said energy requirements to properly operate said control circuit means are in a form of reference voltage V(P) substantially equal to a minimum voltage at which said control circuit means is still able to operate.

4. A process in accordance with claim 3, further comprising:

entering a state B0 when said loaded and unloaded power supply voltages are greater than V(1);

entering a state B1 when said loaded power supply voltage is less than V(1) and greater than V(0);

entering a state B2 when said unloaded power supply voltage is less than V(1) and said loaded power supply voltage is greater than V(0);

entering a state B3 when said loaded power supply voltage is less than V(0);

entering a state B4 when said loaded power supply voltage is less than V(P).

5. A process in accordance with claim 4, further comprising:

indicating states B1, B2, B3, and B4 with one of flashing and continuous light.

6. A process in accordance with claim 1, further comprising:

providing a battery as said power supply;

determining a remaining capacity of said battery from a discharge curve of said battery, said discharge curve describing battery voltage as a function of discharge time;

assigning a residual capacity to a predetermined residual battery voltage.

7. A process in accordance with claim 3, further comprising:

initializing said control circuit means with said power supply;

measuring a power supply voltage of said power supply during said initialization and continuing said initialization if said power supply voltage is greater than V(1), and not continuing said initialization if said power supply voltage is less than V(1).

8. A process in accordance with claim 4, further comprising:

measuring said unloaded voltage at periodic intervals;

entering said B0 state if said unloaded voltage is greater than V(1) and entering said B2 state otherwise.

9. A process in accordance with claim 8, further comprising:

measuring said loaded voltage each time said valve is opened;

entering said B0 state if said loaded voltage is greater than V(1) and entering said B1 state otherwise.

10. A process in accordance with claim 4, wherein:

said power supply includes a battery;

a battery change is indicated by means of a flashing LED when state B1 is determined, and when a battery voltage under load corresponds, with respect to the minimum voltage necessary for switching on the valve, to a battery reserve that is lower than a predetermined battery reserve.

11. A process in accordance with claim 4, further comprising:

in said B3 state, blocking said control circuit means from opening said valve in response to said sensory input, generating a continuous light signal, sending a closing pulse to said valve when said sensory input indicates to open said valve, measuring said loaded voltage during said closing pulse to determine whether said ability of said power supply is sufficient for closing said valve.

12. A process in accordance with claim 1, further comprising:

testing said power deliverable by sending and measuring a closing pulse to said valve immediately before an opening of said valve, said testing only being performed when a voltage of the power supply is below a predetermined value;

de-energizing said control circuit means when one of said unloaded and loaded voltages is less than V(P).

13. A device for electronic control of fluid flow, the device comprising:

an electrically operated valve;

a control circuit means for opening and closing said valve in response to sensory input;

indicator means for indicating power deliverability of a battery to energize said valve and said control circuit means to open and close said valve, said indicating means testing said power by sending and measuring a closing pulse to said valve before an opening of said valve.

14. A device in accordance with claim 13, wherein:

said indicator means only testing when a battery voltage is below a predetermined value;

said indicator means indicates the following states of said power supply;

a) Initialization, b) Battery OK, c) Battery reserve in a loaded state corresponds to a predetermined residual battery reserve, d) The battery reserve in an unloaded state corresponds to said predetermined residual battery reserve, e) The battery reserve in the loaded state is essentially 0%, and f) Switching off of the system.

15. A device in accordance with claim 14, wherein said states are indicated by a light flashing at different frequencies.

16. A process for electronic control of fluid flow, the process comprising the steps of:

providing an electrically operated valve;

providing a control circuit means for opening and closing said valve in response to sensory input;

determining a reference voltage V(1) substantially equal to a minimum voltage required to open said valve plus a safety factor;

determining a reference voltage V(0) substantially equal to a minimum voltage required to close said valve;

determining a reference voltage V(P) substantially equal to a minimum voltage required to properly operate said control circuit means;

applying power from a power supply to said control circuit means;

measuring an unloaded voltage of said power supply;

entering a state B0 if said unloaded voltage immediately after said applying of power is greater than V(1) and entering a state B2 when said unloaded power supply voltage is less than V(1);

in said B0 state, substantially continuously measuring said unloaded voltage of said power supply and remaining in said B0 state if said unloaded power supply voltage is greater than V(1) and entering said state B2 when said unloaded power supply voltage is less than V(1);

in said B0 state, measuring a loaded voltage of said power supply when said control circuit means one of opens and closes said valve, and remaining in said B0 state if said loaded voltage is greater than V(1) and entering a state B1 when said loaded voltage is less than V(1);

in said B1 state, measuring said loaded voltage of said power supply when said control circuit means opens said valve, and remaining in said B1 state if said loaded voltage is greater than V(0) and entering a state B3 when said loaded voltage is less than V(0);

in said B2 state, sending a closing pulse to said valve when said sensory input indicates to open said valve, and measuring said loaded voltage during said closing pulse, entering into said B1 state if said loaded voltage is greater than V(0) and entering said state B3 when said loaded voltage is less than V(0).

17. A process in accordance with claim 16, further comprising:

in said B3 state, blocking said control circuit means from opening said valve in response to said sensory input.

18. A process in accordance with claim 16, further comprising:

in said B1 and B2 state, indicating a low battery condition.

19. A process in accordance with claim 16, further comprising:

in said B3 state, sending a closing pulse to said valve when said sensory input indicates to open said valve and measuring said loaded voltage during said closing pulse, entering into said B1 state if said loaded voltage is greater than V(0), and remaining in said B3 state when said loaded voltage is less than V(0).

20. A process in accordance with claim 16, further comprising entering a B4 state when said loaded or unloaded voltage is less than V(P) and de-energizing said control circuit means;

in said B3 and B4 states, indicating non-operation;

designing said valve to cause said minimum voltage required to open said valve to be greater than said minimum voltage required to close said valve.

* * * * *